United States Patent
Kondo et al.

(10) Patent No.: US 8,530,947 B2
(45) Date of Patent: Sep. 10, 2013

(54) SOLID-STATE IMAGE SENSOR

(75) Inventors: Yasushi Kondo, Kyoto (JP); Hideki Tominaga, Uji (JP); Kenji Takubo, Uji (JP); Ryuta Hirose, Kizugawa (JP); Shigetoshi Sugawa, Sendai (JP); Hideki Mutoh, Odawara (JP)

(73) Assignees: Shimadzu Corporation, Kyoto (JP); Tohoku University, Miyagi (JP)

( * ) Notice: Subject to any disclaimer, the term of this patent is extended or adjusted under 35 U.S.C. 154(b) by 15 days.

(21) Appl. No.: 13/382,878

(22) PCT Filed: Jun. 23, 2010

(86) PCT No.: PCT/JP2010/060661
§ 371 (c)(1),
(2), (4) Date: Jan. 6, 2012

(87) PCT Pub. No.: WO2011/004708
PCT Pub. Date: Jan. 13, 2011

(65) Prior Publication Data
US 2012/0112255 A1    May 10, 2012

(30) Foreign Application Priority Data
Jul. 10, 2009  (JP) ................................. 2009-163397

(51) Int. Cl.
*H01L 27/148* (2006.01)
(52) U.S. Cl.
USPC ............. 257/292; 257/E27.133; 257/E31.003
(58) Field of Classification Search
USPC ..................... 438/283; 257/E29.04, E29.268
See application file for complete search history.

(56) References Cited

U.S. PATENT DOCUMENTS

2005/0001277 A1* 1/2005 Rhodes .......................... 257/431
2005/0279998 A1* 12/2005 Cole et al. ...................... 257/59

(Continued)

FOREIGN PATENT DOCUMENTS

| JP | 2001345441 A | 12/2001 |
| JP | 2007081083 A | 3/2007 |
| WO | 2009031301 A1 | 3/2009 |
| WO | 2009031304 A1 | 3/2009 |

OTHER PUBLICATIONS

Kondo et al., "Development of HyperVision HPV-1 High-speed Video Camera" with English abstract Shimadzu Review, vol. 62, No. 1/2, pp. 79-86, Sep. 30, 2005.

(Continued)

*Primary Examiner* — Zandra Smith
*Assistant Examiner* — Tsz Chiu
(74) *Attorney, Agent, or Firm* — Bingham McCutchen LLP

(57) ABSTRACT

A floating diffusion region is formed at an edge of a light-receiving surface of an embedded photodiode, with a transfer gate electrode located therebetween. A first region, with radially extending portions centered on the FD region, and a second region, located to the outside of the first region, are created in the substantially sector-shaped light-receiving surface. A dopant whose conductivity type is the same as the signal charges to be collected in the first region are introduced, whereby an electric field for moving the signal charges from the radially extending sections towards the center is created due to a three-dimensional field effect. As a result, the charge-transfer time is reduced. Additionally, since a circuit element in the subsequent stage can be placed adjacent to the floating diffusion region, the parasitic capacitance of the floating diffusion region can be reduced and a highly sensitive element can be obtained.

18 Claims, 11 Drawing Sheets

(56) References Cited

U.S. PATENT DOCUMENTS

| | | | |
|---|---|---|---|
| 2008/0054319 A1* | 3/2008 | Mouli | 257/292 |
| 2009/0194799 A1* | 8/2009 | Lee et al. | 257/292 |
| 2009/0294816 A1* | 12/2009 | Park et al. | 257/292 |
| 2010/0176423 A1 | 7/2010 | Sugawa et al. | |
| 2010/0208115 A1 | 8/2010 | Sugawa et al. | |
| 2011/0025892 A1* | 2/2011 | Hibbeler et al. | 348/294 |

OTHER PUBLICATIONS

International Preliminary Report on Patentability dated Feb. 14, 2012 and its English translation issued in corresponding PCT application PCT/JP2010/060661.

* cited by examiner

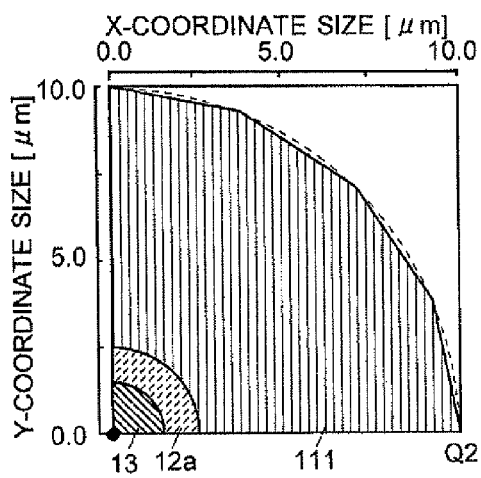
Fig. 4A FIRST ELEMENT SHAPE
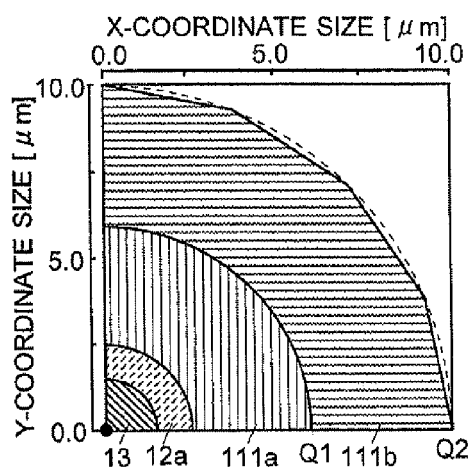
Fig. 4B SECOND ELEMENT SHAPE
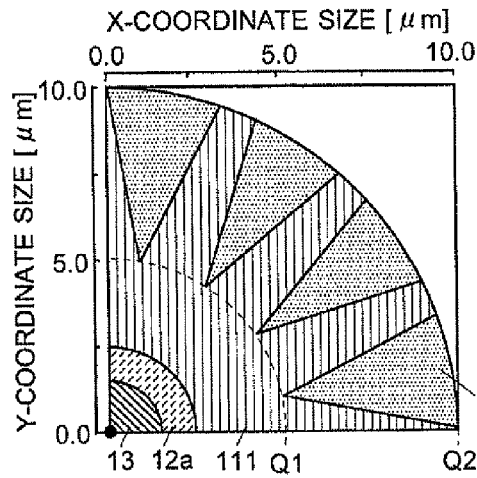
Fig. 4C THIRD ELEMENT SHAPE
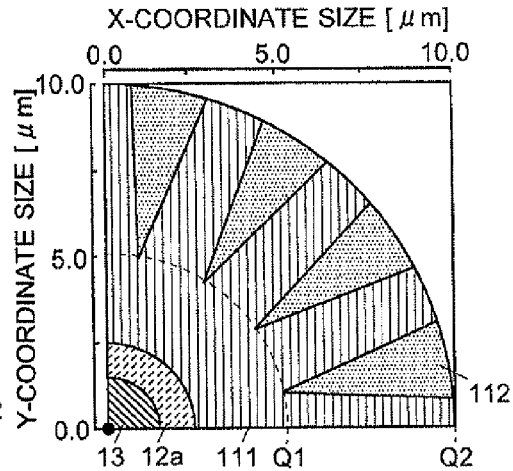
Fig. 4D FOURTH ELEMENT SHAPE
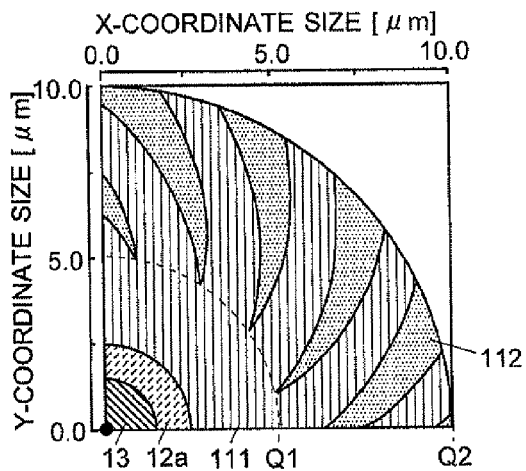
Fig. 4E FIFTH ELEMENT SHAPE

[FIRST ELEMENT SHAPE]

[SECOND ELEMENT SHAPE]

[THIRD ELEMENT SHAPE]

[FOURTH ELEMENT SHAPE]

[FIFTH ELEMENT SHAPE]

[FIRST ELEMENT SHAPE]

[SECOND ELEMENT SHAPE]

[THIRD ELEMENT SHAPE]

[FOURTH ELEMENT SHAPE]

[FIFTH ELEMENT SHAPE]

SOLID-STATE IMAGE SENSOR

CROSS-REFERENCE TO THE RELATED APPLICATIONS

This application is a national stage of international application No. PCT/JP2010/060661, filed on Jun. 23, 2010, and claims the benefit of priority under 35 USC 119 to Japanese Patent Application No. 2009-163397, filed on Jul. 10, 2009, the entire contents of which are incorporated herein by reference.

TECHNICAL FIELD

The present invention relates to a solid-state image sensor, and more specifically, to a solid-state image sensor capable of high-speed operations suitable for taking images of high-speed phenomena, such as types of destructions, explosions or combustions.

BACKGROUND ART

High-speed imaging devices (high-speed video cameras) used for taking consecutive images of high-speed phenomena, such as types of explosions, destructions, combustions, collisions or discharges, for only a short period of time, have been conventionally developed (for example, refer to Non-Patent Document 1). Such high-speed imaging devices need to perform an ultrahigh-speed imaging operation at a level of one million frames per second or even higher. Accordingly, they use solid-state image sensors capable of high-speed operations, which have special structures different from those of conventional image sensors used in normal video cameras, digital cameras and similar devices. As one example of this type of solid-state image sensor, a device called the "in-situ storage image sensor" is disclosed in Patent Document 1 and other documents. This image sensor has a storage charge-coupled device (CCD) capable of consecutively recording a predetermined number of frames without outputting signals to the outside of the sensor. The applicant of the present patent application proposed, in Patent Document 2 and other documents, a CMOS-structure image sensor having a capacitor capable of consecutively recording a predetermined number of frames of image signals without outputting the signals to the outside of the sensor.

In these types of solid-state image sensors, an embedded photodiode is normally used for photoelectric conversion. In the aforementioned ultrahigh-speed imaging operation, the exposure time for the photodiode is extremely short as compared to the normal imaging. Therefore, in order to ensure high detection sensitivity, it is necessary to make the largest possible amount of light fall onto the photodiode in each pixel. For this purpose, it is desirable to make the light-receiving surface of the photodiode as large as possible. However, when the light-receiving surface of an embedded photodiode having a commonly known structure is enlarged, the time required for the photocharges created in the photodiode to reach the floating diffusion region will be measurable, so that a portion of the photocharges fails to reach the floating diffusion region within the short period of time allotted for the photoelectric conversion. As a result, a portion of the charges that should be read out in the current frame will be read out in the next frame. Thus, an afterimage is formed. This is one of the major causes of image degradation in a solid-state image sensor designed for ultrahigh speed operations.

To address this problem, in the solid-state image sensors described in Patent Documents 3 and 4 (as well as other documents), the floating diffusion region is provided at or near the center of the rectangular light-receiving surface of the embedded photodetector, and the gate electrode of the transfer transistor is disposed around the floating diffusion region. This arrangement reduces the maximum distance from the light-receiving surface to the floating diffusion region and shortens the time required for the photocharges to reach the floating diffusion region. This solid-state image sensor is also characterized in that a potential gradient is formed in the direction from the circumference of the light-receiving surface to the center thereof (i.e. to the floating diffusion region) so that the photocharges created in the photodiode can easily gather at the center of the light-receiving surface.

In the previously described solid-state image sensor, since the floating diffusion region, which collects electrons, is located at the center of the light-receiving surface, it is normally necessary to provide a metallic or similar wire for connecting the floating diffusion region to another region outside the light-receiving surface so as to send electric charges through this wire to a circuit in the subsequent stage. However, this wire is a capacitive load, which lowers the charge-to-voltage conversion gain of the floating diffusion region and decreases its sensitivity. Additionally, the image sensor according to Patent Document 4, in which the channel width monotonously decreases as the distance from the center increases, has the problem that, if a P-well/N-sub structure is adopted for some reason (e.g. in order to use a vertical overflow drain or suppress crosstalk), the photocharges generated in an area where no channel is present will flow toward the substrate, which results in a decrease in the sensitivity.

BACKGROUND ART DOCUMENT

Patent Document

Patent Document 1: JP-A 2001-345441
Patent Document 2: WO-A1 2009/031301
Patent Document 3: WO-A1 2009/031304
Patent Document 4: JP-A 2007-81083

Non-Patent Document

Non-Patent Document 1: Kondo et al., "Kousokudo Bideo Kamera HyperVision HPV-1 no Kaihatsu (Development of "HyperVision HPV-1" High-Speed Video Camera)", *Shimadzu Hyouron* (*Shimadzu Review*), Shimadzu Hyouron Henshuu-bu, Sep. 30, 2005, Vol. 62, No. 1/2, pp. 79-86

DISCLOSURE OF THE INVENTION

Problem to be Solved by the Invention

The present invention has been developed in view of the aforementioned problems, and its objective is to provide a solid-state image sensor capable of high-speed operations with high sensitivity and with only minor afterimages, by producing signals in such a manner that the photocharges created in a photodiode can be efficiently reflected in the signal even when the time for accumulating the photocharges is short.

Means for Solving the Problems

The first aspect of the present invention aimed at solving the aforementioned problem provides a solid-state image sensor having a plurality of picture elements on a semiconductor substrate, each of the picture elements including: a photodiode for receiving light and generating photocharges; a floating diffusion region for collecting and holding electric charges generated by the photodiode; and a transfer transistor having a transfer gate between the photodiode and the floating diffusion region so as to transfer electric charges from the photodiode to the floating diffusion region, wherein:

the floating diffusion region is located at an edge of a light-receiving surface of the photodiode; and in the light-receiving surface of the photodiode, an entire region inside a first arc drawn around the floating diffusion region and outside the transfer gate, and a region inside each of a plurality of extending portions radially extending outwards from the first arc, with their distal ends being in contact with a second arc drawn concentric with the first arc, are formed as regions whose conductivity type is same as a signal charge to be collected.

In the solid-state image sensor according to the first aspect of the present invention, each of the extending portions may extend outwards from the first arc along a straight, curved or hooked line.

The second aspect of the present invention aimed at solving the aforementioned problem provides a solid-state image sensor having a plurality of picture elements on a semiconductor substrate, each of the picture elements including: a photodiode for receiving light and generating photocharges; a floating diffusion region for collecting and holding electric charges generated by the photodiode; and a transfer transistor having a transfer gate between the photodiode and the floating diffusion region so as to transfer electric charges from the photodiode to the floating diffusion region, wherein:

the floating diffusion region is located at an edge of a light-receiving surface of the photodiode; and in the light-receiving surface of the photodiode, a region inside an arc drawn around the floating diffusion region and outside the transfer gate, and a region inside each of a plurality of extending portions radially extending outwards from the arc, are formed as regions whose conductivity type is the same as a signal charge to be collected.

In one preferable mode of the solid-state image sensor according to the second aspect of the present invention, the lengths of the extending portions are substantially equal.

In one mode of the solid-state image sensor according to the first or second aspect of the present invention, the light-receiving surface of the photodiode, when viewed in a planar view, is located within a sector-shaped region centered on the floating diffusion region, with the transfer gate located therebetween.

For example, as a first mode, the light-receiving surface of the photodiode, when viewed in a planar view, may have two straight edges out of alignment with each other, with the floating diffusion region located at an intersection of extensions of the aforementioned two edges. In this case, the angles formed by the two extensions of the aforementioned straight edges at their intersection may be any angles.

As a second mode, the light-receiving surface of the photodiode, when viewed in a planar view, may have two straight edges in alignment with each other, with the floating diffusion region located at a middle point between the two edges. The second mode corresponds to the configuration excluded from the first mode; that is to say, in the second mode, the angles formed by the two extensions of the two edges at their intersection are 180 degrees.

As a third mode, the light-receiving surface of the photodiode, when viewed in a planar view, may have an indent extending inwards from a circumferential edge, with the floating diffusion region located at a deepest position of the indent.

When the signal charges to be collected are electrons, the aforementioned "region whose conductivity type is to the same as a signal charge to be collected" is an n-type region formed in a laminated base body (which is normally a p-type well) on a semiconductor substrate by introducing an impurity, or dopant, (e.g. phosphorous or arsenic) into the base body by an ion injection or similar process.

In any of the first through third modes, the floating diffusion region, when viewed in a planar view, is not entirely surrounded by the light-receiving surface of the photodiode; at least a portion of the floating diffusion region borders the laminated base body formed on a semiconductor substrate. Accordingly, a region for resetting and amplifying electric charges collected in the floating diffusion region can be continuously or adjacently provided on the base body bordering the floating diffusion region. This structure reduces the capacitance of the floating diffusion region and thereby prevents a decrease in the sensitivity.

In the solid-state image sensor according to the first or second aspect of the present invention, photocharges are generated over the entire light-receiving surface of the photodiode. When the signal charges to be collected are electrons, each photocharge (electrons) generated in a p-type doped region may either diffuse through a P-well into the substrate or move toward the radially extending n-type doped regions. If the gaps between the adjacent n-type doped regions are adequately narrow, photocharges are more likely to reach the n-type doped regions due to the horizontal field effect than to reach the substrate.

The radially extending n-type doped regions have their distal portions surrounded by p-type doped regions. This design creates a three-dimensional field effect, which causes the potential at the distal portions to be shallower (the voltage level to be lower) than at the n-type doped regions near the transfer gate. As a result, an electric field in which the potential becomes deeper (the voltage level becomes higher) from the circumference toward the central region is created, whereby photocharges are efficiently moved toward the central region. In the present case, it is not always necessary to shape the radially extending n-type doped region so that their width decreases toward the distal portion.

Thus, in the solid-state image sensor according to the first or second aspect of the present invention, an electric field for transferring signal charges from the circumference toward the center (the floating diffusion region) can be efficiently created, while suppressing the area of the doped regions which have a conductivity type opposite to the signal charges and hence easily allow photocharges to flow into the substrate.

In this case, each of the extending portions, when viewed in a planar view, may have a shape tapering from the proximal end to the distal end. Tapering the extending portion to the distal end causes the potential gradient to be steeper due to the narrow channel effect. The steeper potential gradient increases the moving speed of the electric charges, which is advantageous for shortening the time required for the electric charges to reach the floating diffusion region.

Decreasing the width of the extending portions conversely increases the gap between the adjacent extending portions, which increases the possibility that electric charges generated at an outer region flows into the substrate without reaching the doped region whose conductivity type is to the same as the signal charges to be collected. To avoid this situation, it is preferable to design the planar shape of the extending portions so that the edges on both sides of the distal portion are curved or hooked toward the same direction. This design increases the area of the doped regions whose conductivity type is the same as the signal charges and decreases the area of the doped regions of the opposite conductivity type, while maintaining the strength of the electric field directed toward the center. As a result, the charge-collecting efficiency is improved. Not all the extending portions need to be curved or hooked toward the same direction; a substantially high level of charge-collecting efficiency can be achieved even if the extending portions have a different shape (e.g. a mirror-symmetrical shape).

In the solid-state image sensor according to the first or second aspect of the present invention, the aforementioned regions whose conductivity type is the same as the signal charge to be collected may include a plurality of regions having different potential depths so as to help signal charges move toward the floating diffusion region. Such regions having different potential depths can be easily created by changing the injecting depth of dopant ions in the substrate or the dopant concentration by using a plurality of photomasks. This technique makes it possible to make the potential gradient even steeper to increase the moving speed of the electric charges.

Effect of the Invention

In the solid-state image sensors according to the first and second aspects of the present invention, when the transfer transistor is activated to open the gate, the electric charges generated on the light-receiving surface of the photodiode are efficiently transferred to the floating diffusion region within a short period of time, and the electric charges collected in the floating diffusion region are smoothly and quickly sent to a circuit in the subsequent stage. Thus, the detection sensitivity and signal-to-noise ratio can be improved without losing the speediness of the imaging operation.

BRIEF DESCRIPTION OF THE DRAWINGS

FIGS. 4A-4E are plan views respectively showing the first through fifth element shapes prepared for a simulation.

BEST MODE FOR CARRYING OUT THE INVENTION

One embodiment of the solid-state image sensor according to the present invention is hereinafter described with reference to the attached drawings.

The overall configuration and structure of the solid-state image sensor according to the present embodiment is similar to those of a conventional ultrahigh-speed solid-state imaging sensor having a CMOS structure, such as the one described in Patent Document 2. The following descriptions mainly deal with the details of the structure and shape of the elements constituting each picture element (pixel) characteristic of the solid-state image sensor of the present embodiment, and particularly, the structure and shape of the photoelectric Conversion element.

Figure 1:
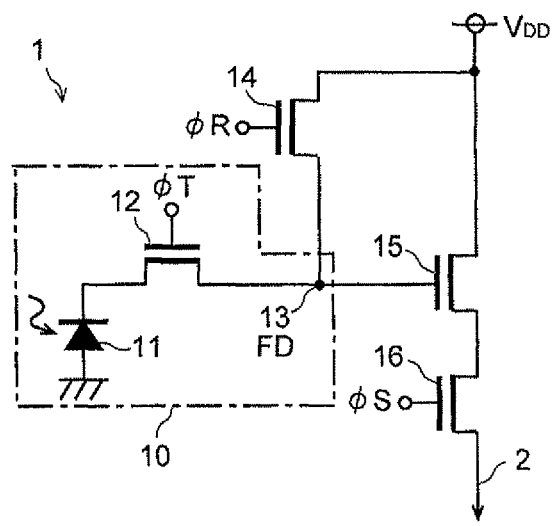
FIG. 1 is a circuit configuration diagram of one picture element in a solid-state image sensor according one embodiment of the present invention.

FIG. 1 is a circuit configuration diagram of one pixel 1 in the solid-state image sensor of the present embodiment. The pixel 1 includes: a photodiode 11 for receiving light and generating photocharges; a transfer transistor 12, located adjacent to the photodiode 11, for transferring photocharges; a floating diffusion region 13, connected to the photodiode 11 via the transfer transistor 12, for temporarily storing photocharges and converting them into a voltage signal; a reset transistor 14 for resetting the potential in the floating diffusion region; an amplifying transistor 15 for amplifying the amount of signal charges; and a selection transistor 16 for selecting a pixel. An output line 2, through which a pixel signal can be read, is extended to an external region (not shown) and connected, for example, to a vertical signal line or a capacitor for memorizing the pixel signal.

To increase the photoelectric conversion gain in each pixel 1, the capacitance of the floating diffusion region 13 used for converting photocharges into a voltage should be as low as possible.

Figure 2:
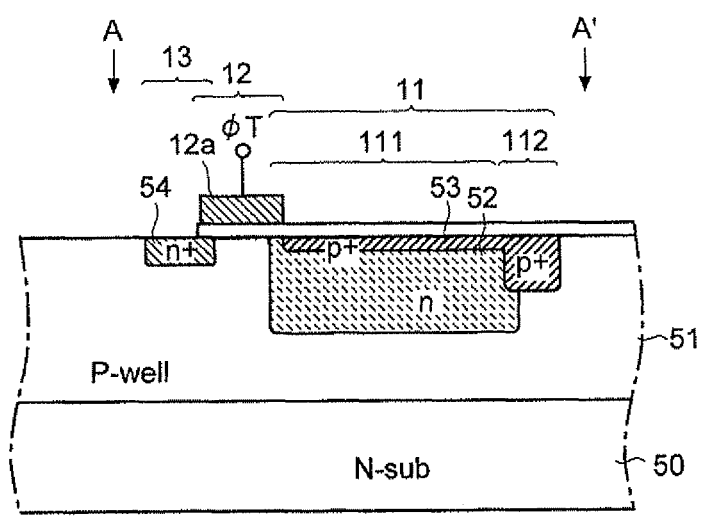
FIG. 2 is a schematic vertical sectional view of a photoelectric conversion element in the solid-state image sensor of the present embodiment.
Figure 3A:
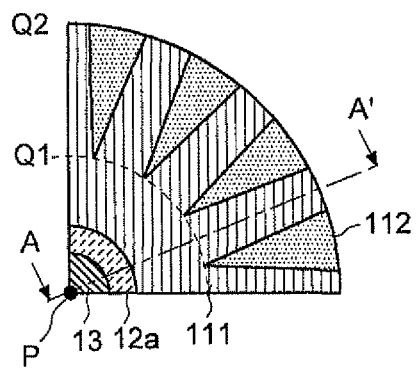
FIGS. 3A-3D are plan views showing examples of the photoelectric conversion element in the solid-state image sensor of the present embodiment.
Figure 3B:
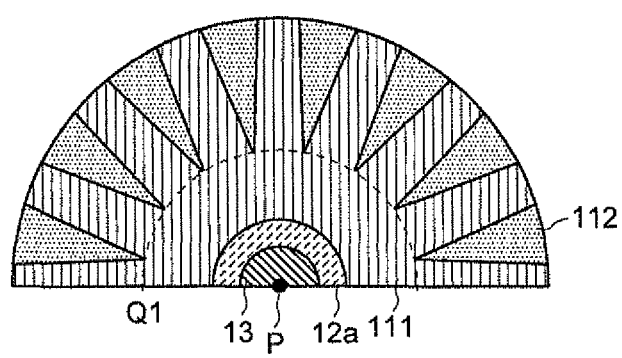
Figure 3C:
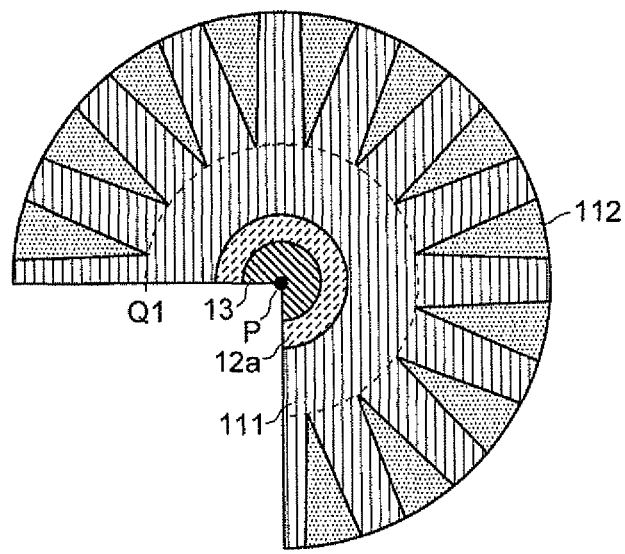
Figure 3D:
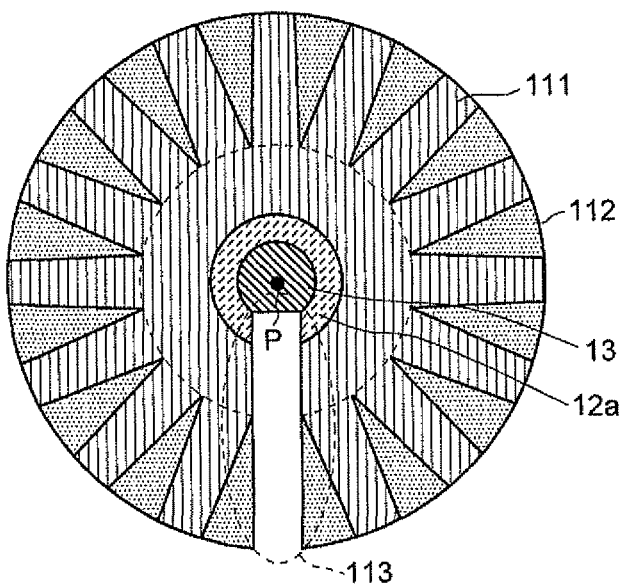
Figure 5:
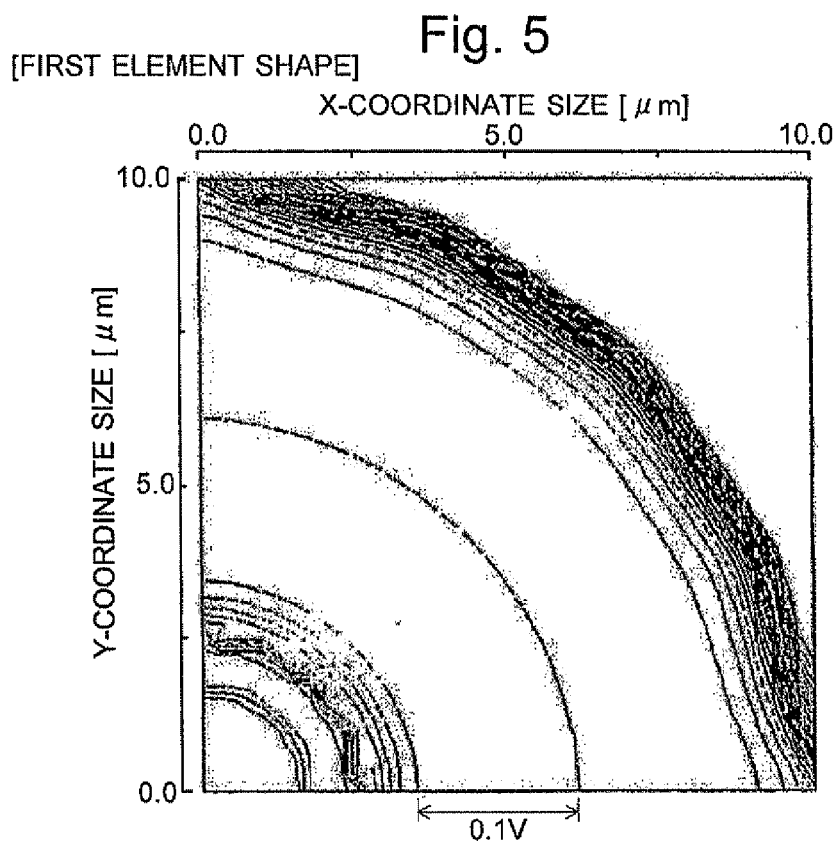
FIG. 5 is a two-dimensional potential contour map showing the result of the simulation for the first element shape.
Figure 6:
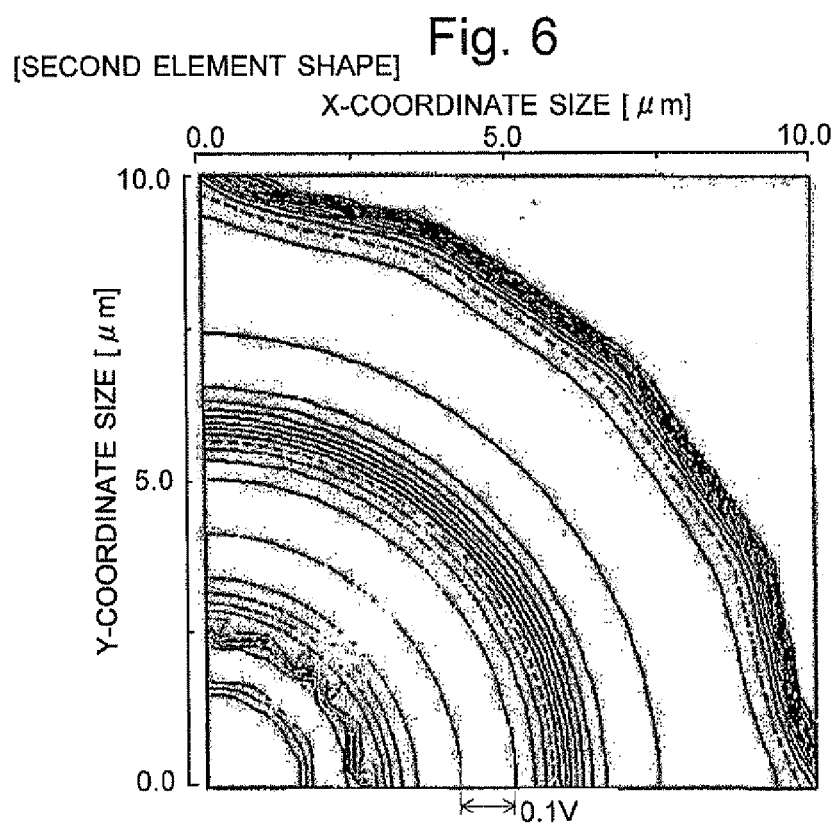
FIG. 6 is a two-dimensional potential contour map showing the result of the simulation for the second element shape.
Figure 7:
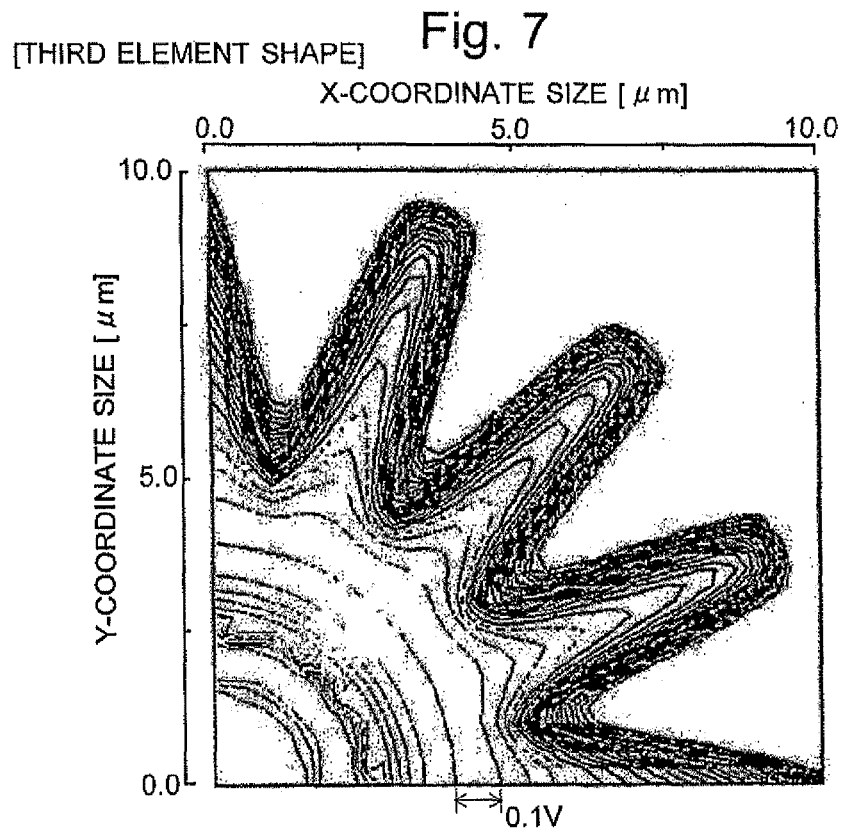
FIG. 7 is a two-dimensional potential contour map showing the result of the simulation for the third element shape.
Figure 8:
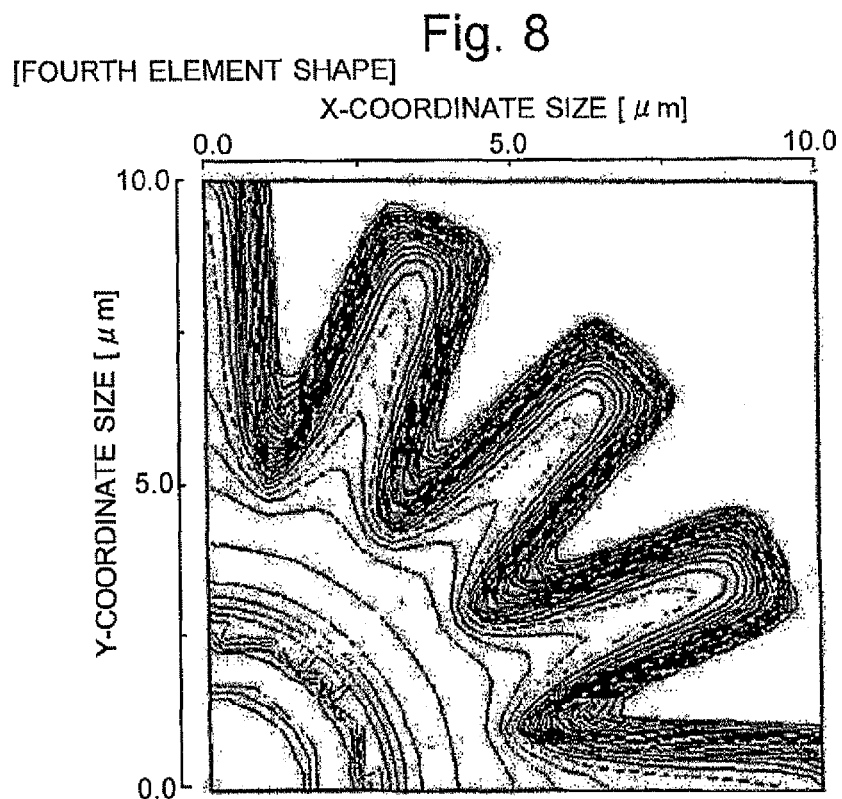
FIG. 8 is a two-dimensional potential contour map showing the result of the simulation for the fourth element shape.
Figure 9:
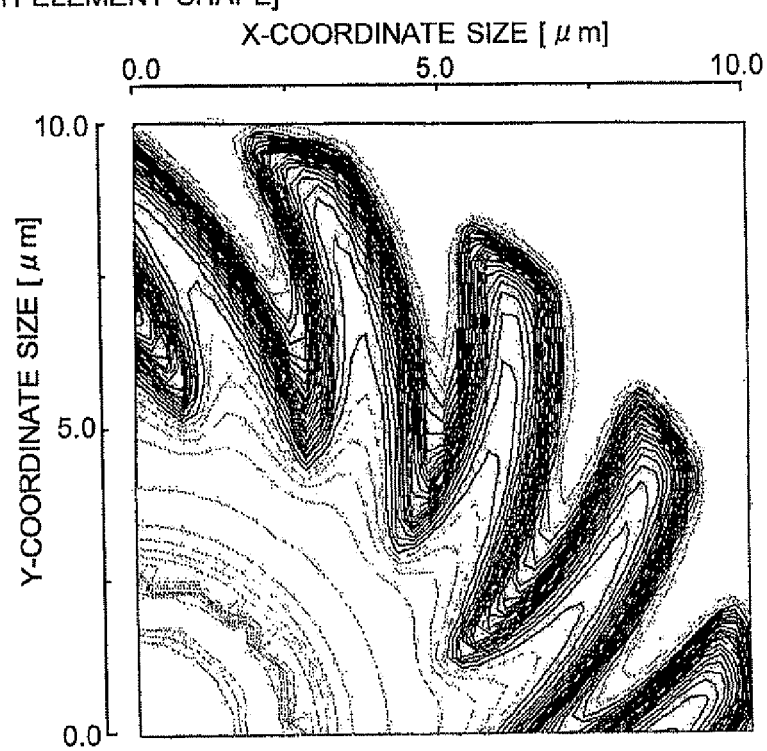
FIG. 9 is a two-dimensional potential contour map showing the result of the simulation for the fifth element shape.
Figure 10:
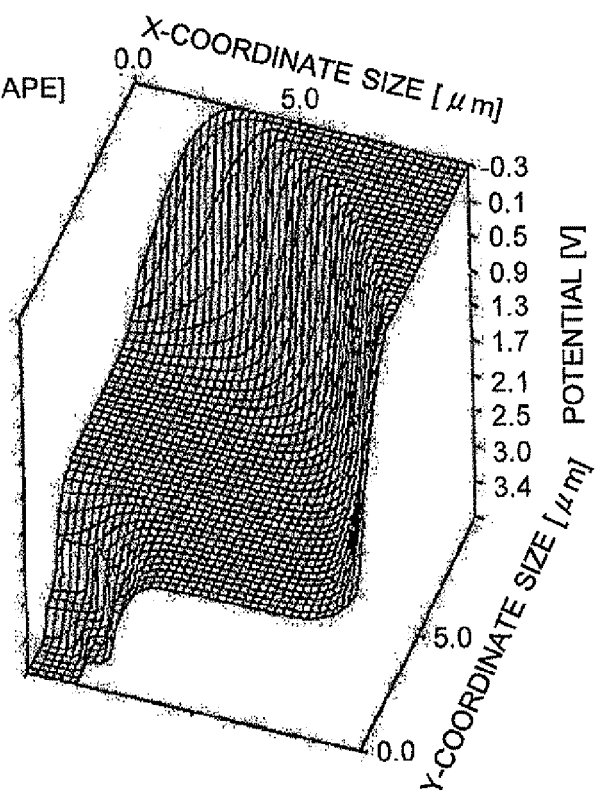
FIG. 10 is a three-dimensional bird's-eye view showing the result of the simulation for the first element shape.
Figure 11:
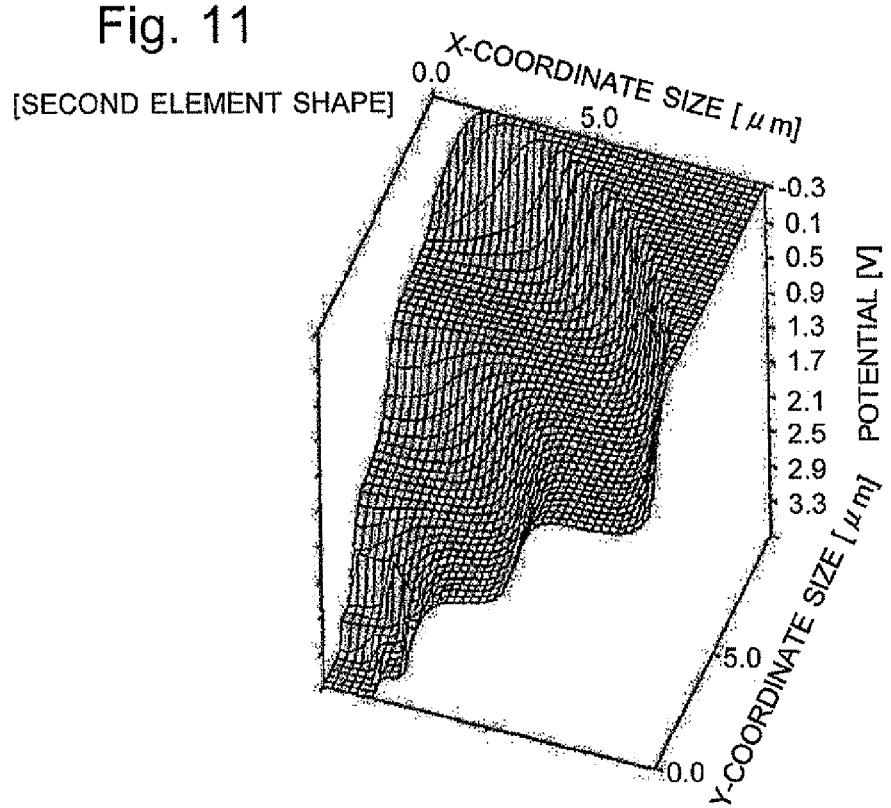
FIG. 11 is a three-dimensional bird's-eye view showing the result of the simulation for the second element shape.
Figure 12:
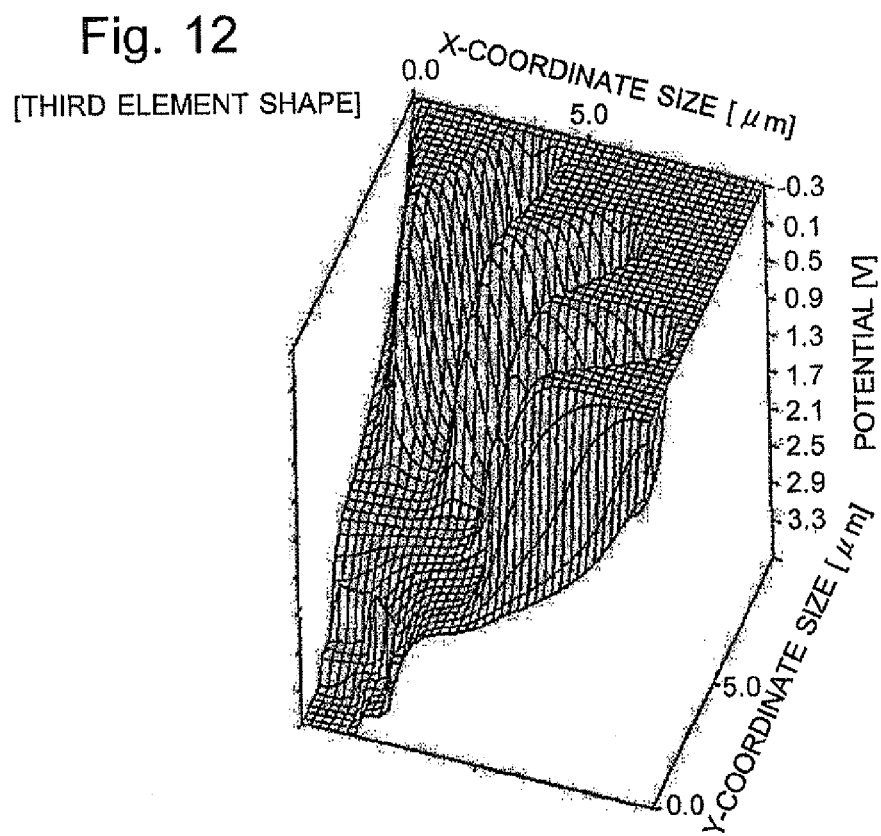
FIG. 12 is a three-dimensional bird's-eye view showing the result of the simulation for the third element shape.
Figure 13:
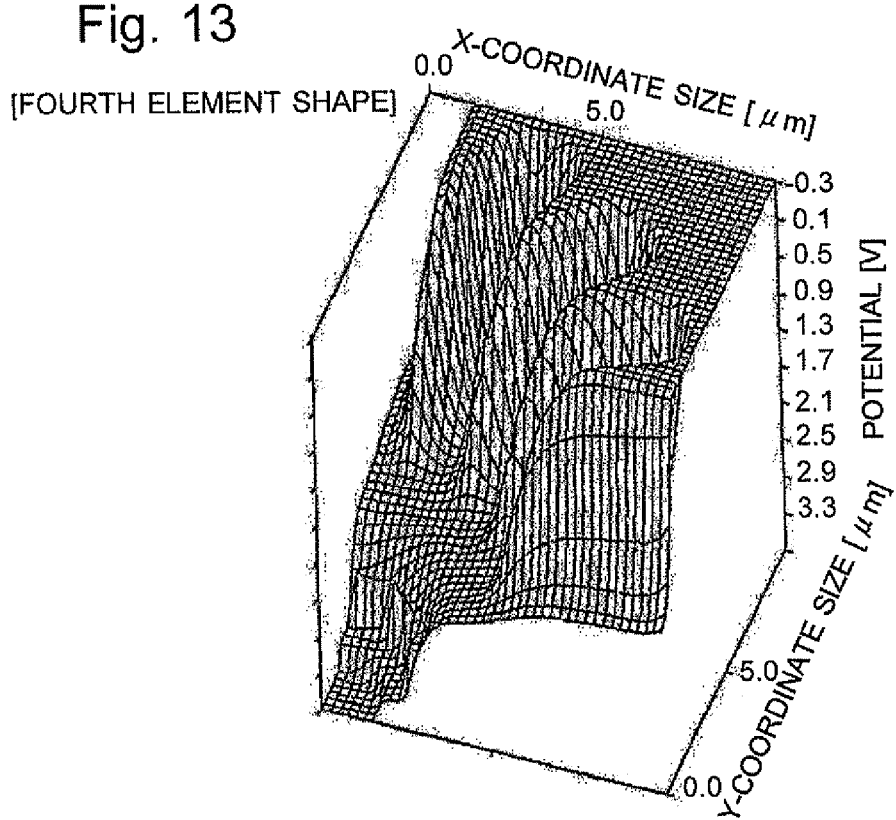
FIG. 13 is a three-dimensional bird's-eye view showing the result of the simulation for the fourth element shape.
Figure 14:
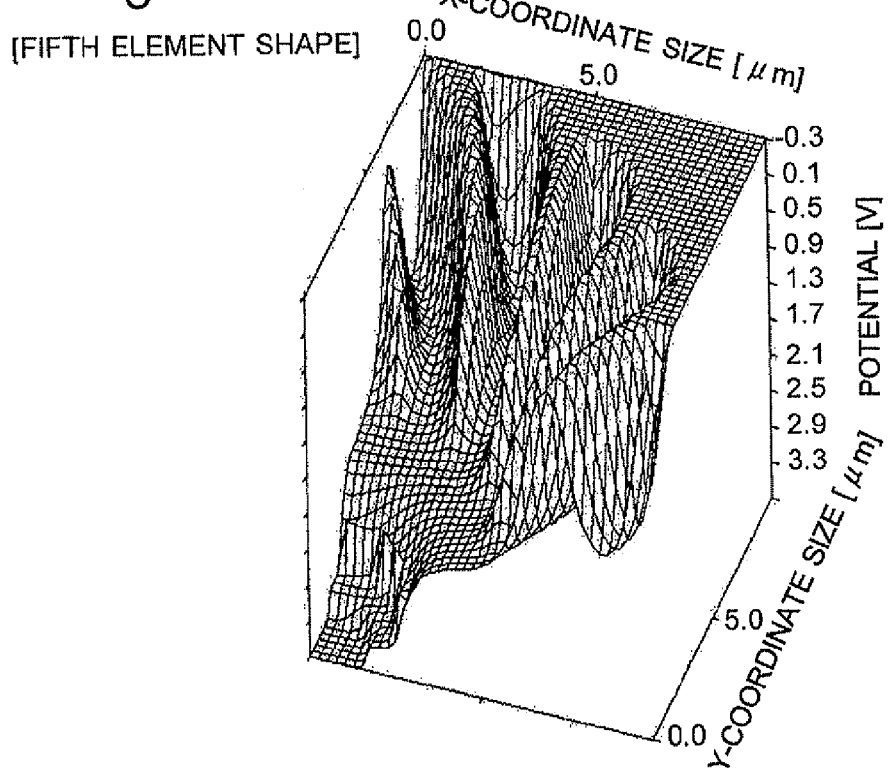
FIG. 14 is a three-dimensional bird's-eye view showing the result of the simulation for the fifth element shape.

In FIG. 1, the photodiode 11, transfer transistor 12 and floating diffusion region 13 constitute a photoelectric conversion element 10, and it is this photoelectric conversion element 10 that has a characteristic structure. FIGS. 3A-3D are plan views showing layout patterns of the photoelectric conversion element 10, where FIG. 3A shows the basic pattern, and FIGS. 3B-3D show extended patterns based on the pattern of FIG. 3A. FIG. 2 is a schematic vertical sectional view at a plane indicated by the arrows A and A' in FIG. 3A.

The photodiode 11 has an embedded photodiode structure. That is to say, as shown in FIG. 2, a p-type well (P-well)

region 51 having a predetermined thickness is formed on an n-type silicon semiconductor substrate (N-sub) 50, and an n-type semiconductor region 52 is formed in the p-type well region 51. A p$^+$-type semiconductor region 53 is formed on the surface of the n-type semiconductor region 52. Thus, the embedded photodiode 11 is created by the p-n junction of the n-type semiconductor region 52 and the p$^+$-type semiconductor region 53. As shown in FIG. 3A, the photodiode 11 has a light-receiving surface whose entire plan view shape is substantially sector, with a concentral quadrant recess.

The n-type semiconductor region 52 is not formed in the quadrant portion. Within this quadrant area, an n$^+$-type semiconductor region 54 is formed on the surface of the p-type well region 51. This area functions as the floating diffusion region 13. Between this floating diffusion region 13 (i.e. the n$^+$-type semiconductor region 54) and the n-type semiconductor region 52, an annular gate electrode 12a made of a polysilicon or other materials is formed via an insulating film on the surface layer. Thus, the transfer transistor 12 is created.

As shown in FIG. 3A, the light-receiving surface of the photodiode 11, which is substantially sector-shaped when viewed in a planar view, is divided into two types of regions: the first and second regions 111 and 112. The first region 111 consists of an area inside an arc (first arc) Q1 drawn around the floating diffusion region 13, i.e. around the intersection P of the extensions of the two straight edges of the light-receiving surface of the photodiode 11, and a plurality of extending portions which extend from the arc Q1 outwards with their distal ends being in contact with another arc (second arc) Q2 drawn around the intersection P. The second regions 112 are individually sandwiched between the extending portions neighboring each other in the circumferential direction. Each of the extending portions radially extends from the proximal end, which is in contact with the arc Q1, to the distal end, which is in contact with the arc Q2. The lengths of all the extending portions are approximately equal.

Both the first and second regions 111 and 112 function as the light-receiving surface. However, a difference exists in that the first region 111 is a doped region whose conductivity type is the same as the signal charges to be collected, while the second region 112 filling the gap of the first region 111 is a doped region whose conductivity type is opposite to the signal charges. Normally, such a difference in the type of the doped regions can be easily created by using a photomask and selectively injecting different impurities, such as phosphorous, arsenic or boron. As a result, each of the extending portions is surrounded by the doped region whose conductivity type is opposite to the signal charges, so that the potential energy at the extending portions becomes higher than in the area inside the arc Q1 due to a three-dimensional field effect. More specifically, a step-like change in the potential occurs between the extending portions radially extending outwards from the arc Q1 and the area inside the arc Q1, whereby a potential gradient is formed in the direction from the outer (circumferential) portion to the central portion of the sector-shaped photodiode. This potential gradient, in its entirety, has the effect of moving signal charges from positions farther than the floating diffusion region 13 on the light-receiving surface of the photodiode 11 toward the floating diffusion region 13. Specific examples of the form of the potential gradient will be described later.

In the photoelectric conversion element 10 having the previously described configuration, when electric charges are generated in the vicinity of the pn junction by light falling onto the light-receiving surface of the photodiode 11, the generated charges are accelerated toward the floating diffusion region 13 by the aforementioned potential gradient. At this moment, if the gate electrode 12a of the transfer transistor 12 is in the closed state, the electric charges gather around the gate electrode 12a. Subsequently, when the gate electrode 12a is opened, the electric charges are collectively transferred to the floating diffusion region 13, to be eventually reflected in the pixel signal. Since the potential in the second region 112 is approximately flat, the motion of the electric charges produced in this region is rather slow. However, they can reach the first region 111 within a short period of time, because the first region 111 has a plurality of extending portions radially extending outwards and, from any position within the second region 112, the moving distance to the first region 111 is relatively short. Upon reaching the first region 111, the electric charges are accelerated by the aforementioned steep potential gradient and gather around the gate electrode 12a within a short period of time. Therefore, when the gate electrode 12a is opened, the electric charges will be efficiently transferred to the floating diffusion region 13.

If the transfer transistor 12 is maintained in the "on" state while the incident light is being received, the photocharges moving along the potential gradient and gathering around the gate electrode 12a will immediately pass through the region under the gate electrode 12a and flow into the floating diffusion region 13. Thus, in any of the two cases, the photocharges generated by the photodiode 11 can be efficiently and quickly transferred to the floating diffusion region 13.

In this manner, photocharges can reach the floating diffusion region 13 within a short period of time, irrespective of where on the light-receiving surface of the photodiode they are generated. Even if only a short period of time is allotted for the storage of the photocharges, there will be only a minor amount of photocharges failing to reach the floating diffusion region 13. As a result, the amount of charges remaining in the photodiode 11 in the process of reading signal charges will be decreased, so that afterimages will be suppressed and the image quality will be improved.

The floating diffusion region 13 is located on an edge of the light-receiving surface of the photodiode 11. This design allows the reset transistor 14 and the amplifying transistor 15 to be disposed adjacent to the floating diffusion region 13 (though not shown in FIGS. 2 and 3A). Accordingly, it is possible to reduce the capacitance of the floating diffusion region 13 and increase its charge-to-voltage conversion gain, whereby a high level of sensitivity will be achieved.

As stated previously, FIG. 3A is a basic layout pattern of the element. It is evident that an element obtained by combining two pieces (see FIG. 3B) or three pieces (see FIG. 3C) of the basic layout pattern can similarly make the aforementioned effects. Furthermore, as shown in FIG. 3D, it is possible to combine four pieces of the basic layout pattern shown in FIG. 3A and remove a portion of the light-receiving surface of the photodiode 11 to form an indent portion 113 extending inwards from the circumferential edge. According to this design, a portion with no gate electrode 12a, no n-type semiconductor region 52 and no p$^+$-type semiconductor region 53 is formed on one side of the floating diffusion region 13. Such an element can also be regarded as one variation of the element having the floating diffusion region 13 located on an edge of the light-receiving surface of the photodiode 11.

In the solid-state image sensor according to the present invention, the previously described basic layout pattern of the photoelectric conversion element shown in FIG. 3A can be modified into various forms. FIGS. 4A-4E are plan views respectively showing the first through fifth element shapes (layout patterns) considered for a simulation, which will be described later. Among these shapes, the fourth element shape shown in FIG. 4D corresponds to FIG. 3A. Any of the other layout patterns shown in FIGS. 4A-4E can be similarly adopted as the basic layout pattern and used as shown in FIGS. 3A-3D without any changes. It is also possible to adopt a layout in which the central angle of the sector is set at a desired angle.

The first element shape shown in FIG. 4A is formed so that the concentration of the dopant whose conductivity type is the same as the signal charges is nearly uniform within the area inside the arc Q2 drawn around the intersection P (the origin), except for the portion of the floating diffusion region 13 and the gate electrode 12a, among the light-receiving surface of the photodiode 11. In the second element shape shown in FIG. 4B, the first region 111 is divided into inner and outer regions (111a and 111b) by the arc Q1 drawn around the intersection P. As compared to the outer region 111b (the region sandwiched between the inner arc Q1 and the outer arc Q2), the inner region 111a has a higher concentration of the dopant whose conductivity type is the same as the signal charges. In this case, a step-like potential change also occurs at the boundary of the inner region 111a and the outer region 111b.

The outer boundary of the first region 111 shown in FIGS. 4A and 4B is not exactly an arc but shaped like a polygon. This is because using an arc in the simulation computation is difficult. For simulation purposes, the polygonal line is virtually equivalent to an arc.

The third element shape shown in FIG. 4C is basically the same as the fourth element shape shown in FIG. 4D. The difference is that the radially extending portions in FIG. 4C are more noticeably tapered. The fifth element shape shown in FIG. 4E is a variation of the fourth element shape and has each extending portion being curved counterclockwise by an angle proportional to the distance from the connection point (proximal end) of the extending portion on the arc Q1 (that is to say, it is curved like a bow). This shape has approximately the same channel area as that of the fourth element shape. However, as compared to the fourth element shape, the channel of the extending portion is more noticeably tapered toward the distal end. This difference in the element shape creates a difference in the potential distribution, as is evident from the result of a simulation to be described subsequently.

A simulation computation performed for the previously described five types of element shapes is hereinafter described. In this simulation, layout patterns having the size as shown in FIGS. 4A-4E were considered, and a reflective boundary condition was set in both X and Y directions for all layout patterns. More specifically, the Fermi level within an area outside an arc having a radius of 6 [μm] around the origin (intersection P) was set to be shallower, and it was assumed that approximately $1\times10^4$ electrons existed in this area in the initial state. Under the condition that a voltage of 3 [V] was continuously applied to the gate electrode 12a of the transfer transistor 12 (i.e. the gate electrode 12a was maintained in the open state), the movements of electrons until a lapse of 10 [nsec] were analyzed by simulation.

Figure 15:
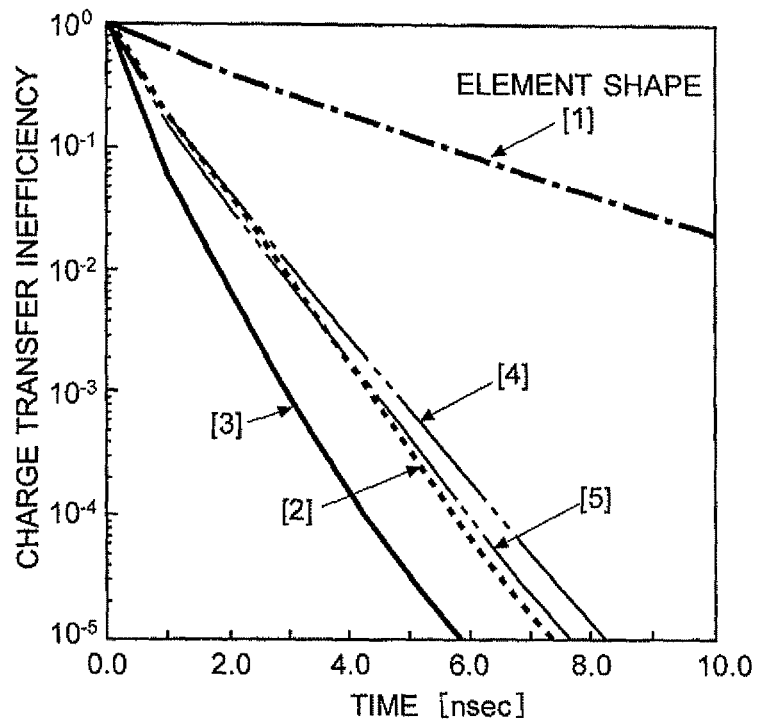
FIG. 15 is a graph showing the result of an electron-transfer simulation for the first through fifth element shapes.
Figure 16:
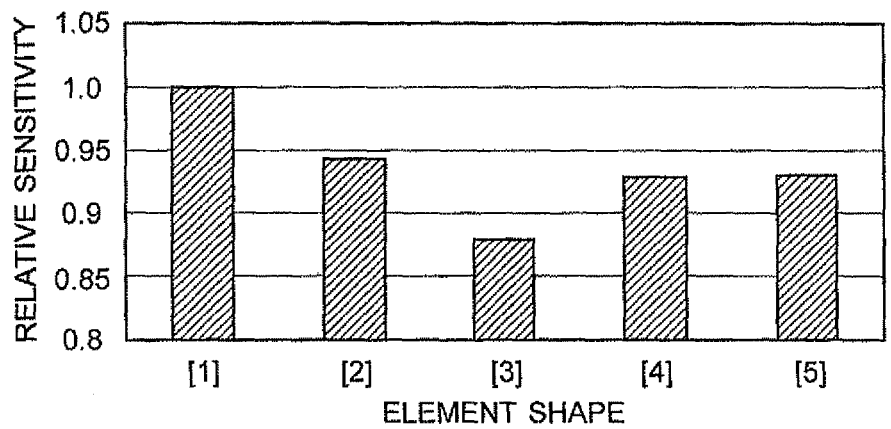
FIG. 16 is a graph showing the result of a simulation of the sensitivity of the first through fifth element shapes.

FIGS. 5-9 are two-dimensional contour maps respectively showing the potential distributions in the first through fifth element shapes in the end state (when the period of 10 [nsec] had elapsed). The equipotential lines in FIGS. 5-9 are drawn at intervals of 0.1 [V]. FIGS. 10-14 are bird's eye views respectively showing the potential distributions in the first through fifth element shapes in the end state. FIG. 15 is a graph showing the result of an electron-transfer simulation for the first through fifth element shapes, where the horizontal axis indicates the elapsed time, and the vertical axis indicates the ratio of electrons remaining within the area farther than the gate electrode 12a from the floating diffusion region 13. FIG. 16 is the result of a simulation of the sensitivity of the first through fifth element shapes, where the horizontal axis indicates the number of each element shape, and the vertical axis indicates the relative sensitivity having a value of 1 for the first element shape.

Suppose that an amount of electric charges corresponding to a few tens of thousands of electrons has been stored. From FIG. 15, it can be understood that the transfer of electrons from the photodiode 11 to the floating diffusion region 13 will be completed within 10 [nsec] in the cases of the second through fifth element shapes. On the other hand, in the case of the first element shape, it is expected that the time for completing the transfer from the photodiode 11 to the floating diffusion region 13 will be roughly three to ten times as long as the aforementioned period. This is most likely because, within the first region 111, the potential gradient in the region near the gate electrode 12a is gentler, as is evident from the results shown in FIGS. 5-14. Comparing the third element shape with the fourth one demonstrates that the former is advantageous in that the transfer time is shorter. However, as shown in FIG. 16, the third element shape is inferior in sensitivity since its charge-collecting efficiency is lower due to the broader gap between the extending portions of the first region 111.

In the case of the fifth element shape having the curved extending portions as shown in FIG. 4E, a level of sensitivity comparable to that of the fourth element shape has been achieved. This result suggests that tapering the channel toward the distal end makes a narrow-channel effect, which strengthens the electric field directed toward the floating diffusion region and thereby shortens the transfer time.

Figure 17:
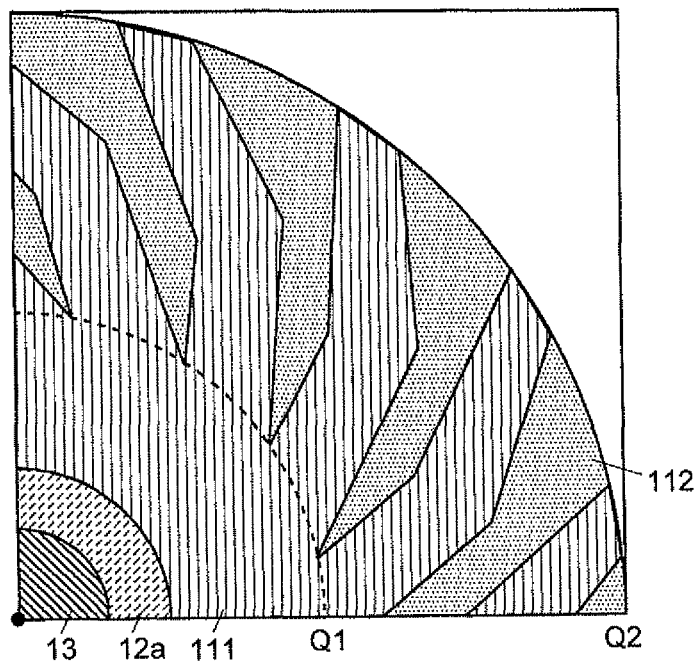
FIG. 17 is a plan view showing another example of the element shape in the solid-state image sensor according to the present invention.
Figure 18:
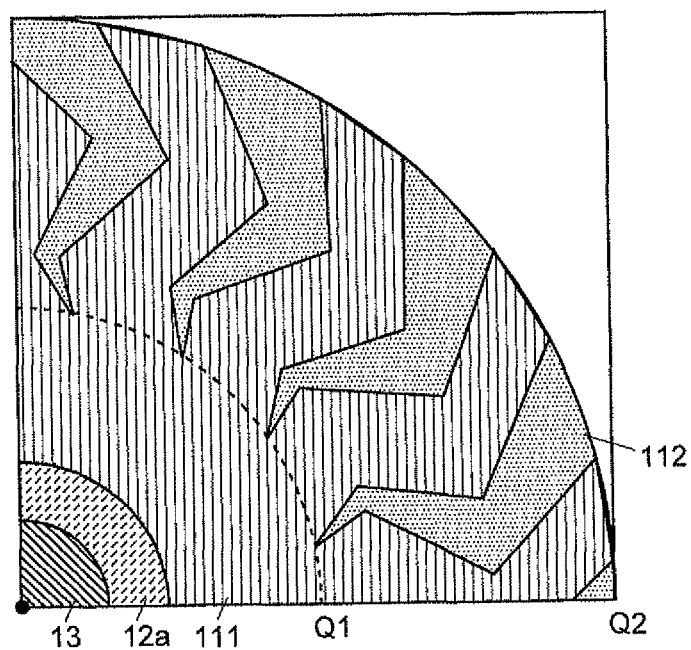
FIG. 18 is a plan view showing still another example of the element shape in the solid-state image sensor according to the present invention.

Other layout patterns of the photoelectric conversion element in the solid-state image sensor according to the present invention are shown in FIGS. 17-20. FIGS. 17 and 18 show variations of the fifth element shape shown in FIG. 4E. In FIG. 17, the extending portion in the first region 111 is not curved but sharply bent at one point in the extending direction thereof. In FIG. 18, each of the extending portions in the first region 111 is doubly bent at two points in the extending direction thereof and toward different directions. Shaping the individual extending portions in this manner results in virtually the same effects as obtained in the case of the curved extending portions.

Figure 19:
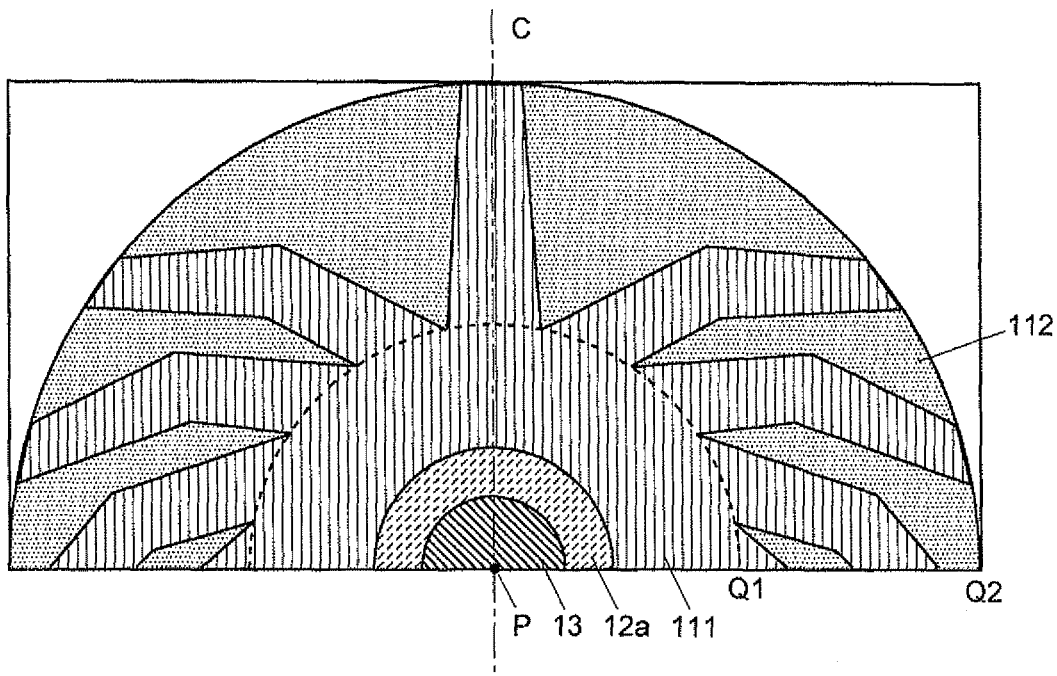
FIG. 19 is a plan view showing still another example of the element shape in the solid-state image sensor according to the present invention.
Figure 20:
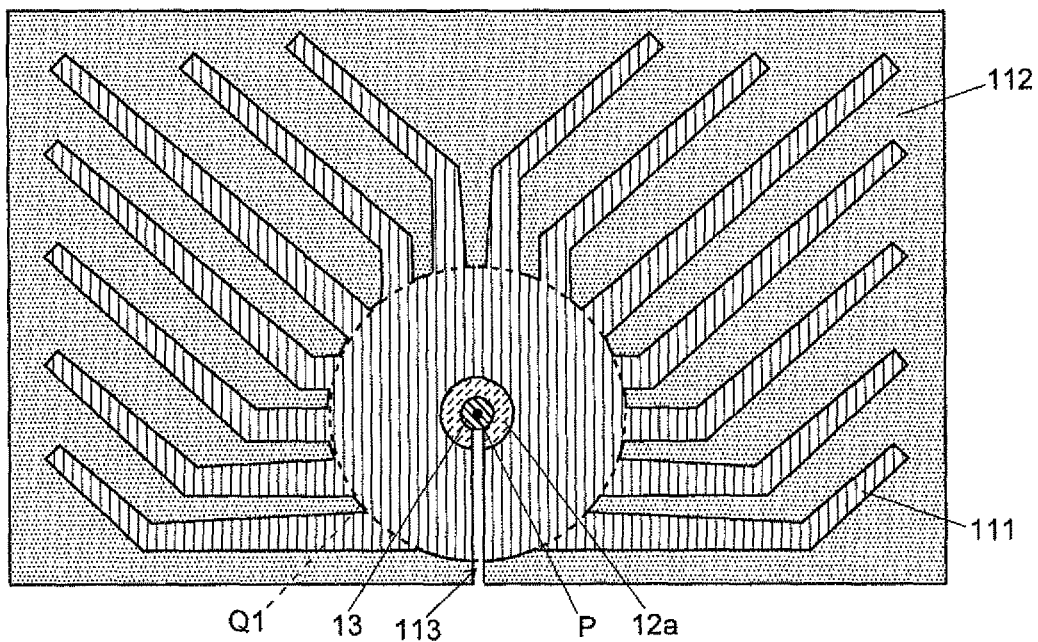
FIG. 20 is a plan view showing still another example of the element shape in the solid-state image sensor according to the present invention.

It is not always necessary to curve or bend all of the extending portions in the same direction. For example, FIG. 19 shows another possible layout, in which the right and left regions are symmetrically arranged with respect to the straight line C passing through the intersection P. Although this layout widens some of the gaps between the extending portions, this causes only a minor influence on the entire effect. Accordingly, it is possible to obtain virtually the same effects as in the case where all the extending portions are curved or bent in the same direction.

In any of the layouts shown in FIGS. 4C, 4D and 4E as well as FIGS. 17-19, the extending portions, which radially extend from the inner arc Q1, have their distal ends in contact with the arc Q2, which is concentric with the arc Q1. However, the distal ends of the extending portions do not always need to be in contact with the arc Q2. In the example shown in FIG. 20, the extending portions radially extending from the arc Q1 have different shapes (i.e. different bending forms), and there is no arc in contact with the distal ends of the extending portions. It should be noted that the extending portions have virtually equal lengths so that electric charges collected at the distal ends of the extending portions will have equal distances to travel until they reach the arc Q1. This design reduces the variation in the charge-transfer time among the extending portions, and hence, is advantageous for improving the charge-collecting efficiency. Naturally, the length, width or curving/bending form of the extending portions may be differently determined for each extending portion according to the surrounding conditions (e.g. the space occupied by the element).

It should be noted that the previous embodiment is a mere example of the present invention, and any change, modification or addition appropriately made within the spirit of the present invention will naturally fall within the scope of claims of the present patent application. For example, it is evident that the previously described operations and effects can be similarly achieved even if the conductivity types of the signal charges and impurities are reversed from the previous description.

EXPLANATION OF NUMERALS

1 . . . Picture Element (Pixel)
10 . . . Photoelectric Conversion Element
11 . . . Photodiode
111, 111a, 111b . . . First Region
112 . . . Second Region
113 . . . Indent Portion
12 . . . Transfer Transistor
12a . . . Gate Electrode
13 . . . Floating Diffusion region
14 . . . Reset Transistor
15 . . . Amplifying Transistor
16 . . . Selection Transistor
2 . . . Output Line
50 . . . n-Type Silicon Semiconductor Substrate
51 . . . p-Type Well Region
52 . . . n-Type Semiconductor Region
53 . . . $p^+$-Type Semiconductor Region
54 . . . $n^+$-Type Semiconductor Region

The invention claimed is:

1. A solid-state image sensor having a plurality of picture elements on a semiconductor substrate, each of the picture elements including:
a photodiode for receiving light and generating photocharges;
a floating diffusion region for collecting and holding electric charges generated by the photodiode; and
a transfer transistor having a transfer gate between the photodiode and the floating diffusion region so as to transfer electric charges from the photodiode to the floating diffusion region,
wherein the floating diffusion region is located at an edge of a light-receiving surface of the photodiode; and in the light-receiving surface of the photodiode, when viewed in a planar view, an entire region inside a first arc drawn around the floating diffusion region and outside the transfer gate, and a region inside each of a plurality of extending portions radially extending outwards, in contrast to the floating diffusion region, from the first arc, with their distal ends being in contact with a second arc drawn concentric with the first arc, are formed as regions whose conductivity type is same as a signal charge to be collected.

2. The solid-state image sensor according to claim 1, wherein each of the extending portions extends outwards from the first arc along a straight, curved or hooked line.

3. The solid-state image sensor according to claim 1, wherein the light-receiving surface of the photodiode, when viewed in a planar view, is located within a sector-shaped region centered on the floating diffusion region, with the transfer gate located therebetween.

4. The solid-state image sensor according to claim 1, wherein the light-receiving surface of the photodiode, when viewed in a planar view, has an indent extending inwards from a circumferential edge, with the floating diffusion region located at a deepest position of the indent.

5. The solid-state image sensor according to claim 1, wherein each of the extending portions, when viewed in a planar view, has a shape tapering from a proximal end to a distal end.

6. The solid-state image sensor according to claim 1, wherein, within the aforementioned regions whose conductivity type is same as the signal charge to be collected, a plurality of doped regions having different potential depths are formed so that the potential depth is greater as a distance to the floating diffusion region is shorter.

7. A solid-state image sensor having a plurality of picture elements on a semiconductor substrate, each of the picture elements including:
a photodiode for receiving light and generating photocharges;
a floating diffusion region for collecting and holding electric charges generated by the photodiode; and
a transfer transistor having a transfer gate between the photodiode and the floating diffusion region so as to transfer electric charges from the photodiode to the floating diffusion region,
wherein the floating diffusion region is located at an edge of a light-receiving surface of the photodiode; and in the light-receiving surface of the photodiode, when viewed in a planar view, a region inside an arc drawn around the floating diffusion region and outside the transfer gate, and a region inside each of a plurality of extending portions radially extending outwards, in contrast to the floating diffusion region, from the arc, are formed as regions whose conductivity type is same as a signal charge to be collected.

8. The solid-state image sensor according to claim 7, wherein lengths of the extending portions are substantially equal.

9. The solid-state image sensor according to claim 8, wherein each of the extending portions extends outwards from the first arc along a straight, curved or hooked line.

10. The solid-state image sensor according to claim 7, wherein the light-receiving surface of the photodiode, when viewed in a planar view, is located within a sector-shaped region centered on the floating diffusion region, with the transfer gate located therebetween.

11. The solid-state image sensor according to claim 7, wherein the light-receiving surface of the photodiode, when viewed in a planar view, has an indent extending inwards from a circumferential edge, with the floating diffusion region located at a deepest position of the indent.

12. The solid-state image sensor according to claim 7, wherein each of the extending portions, when viewed in a planar view, has a shape tapering from a proximal end to a distal end.

13. The solid-state image sensor according to claim 7, wherein, within the aforementioned regions whose conductivity type is same as the signal charge to be collected, a plurality of doped regions having different potential depths are formed so that the potential depth is greater as a distance to the floating diffusion region is shorter.

14. A solid-state image sensor having a plurality of picture elements on a semiconductor substrate, each of the picture elements including:
a photodiode for receiving light and generating photocharges;

a floating diffusion region for collecting and holding electric charges generated by the photodiode; and a transfer transistor having a transfer gate between the photodiode and the floating diffusion region so as to transfer electric charges from the photodiode to the floating diffusion region, wherein the photodiode includes: a semiconductor substrate whose conductivity type is same as signal charges to be collected; a semiconductor layer formed on the semiconductor substrate and having a conductivity type different from the signal charges; a first doped region formed in the semiconductor layer and having the same conductivity type as the signal charges; and a second doped region covering a surface of the first doped region, with an upper surface thereof forming a portion of a light-receiving surface of the photodiode, and a dopant concentration thereof being higher than that of the first doped region; in the light-receiving surface of the photodiode, when viewed in a planar view, a region inside an arc drawn around the floating diffusion region and outside the transfer gate, and a region inside each of a plurality of extending portions radially extending outwards, in contrast to the floating diffusion region, from the arc, are formed as the first doped region; and the floating diffusion region is located at an edge of the light-receiving surface of the photodiode.

15. The solid-state image sensor according to claim 14, wherein the light-receiving surface of the photodiode, when viewed in a planar view, is located within a sector-shaped region centered on the floating diffusion region, with the transfer gate located therebetween.

16. The solid-state image sensor according to claim 14, wherein the light-receiving surface of the photodiode, when viewed in a planar view, has an indent extending inwards from a circumferential edge, with the floating diffusion region located at a deepest position of the indent.

17. The solid-state image sensor according to claim 14, wherein each of the extending portions, when viewed in a planar view, has a shape tapering from a proximal end to a distal end.

18. The solid-state image sensor according to claim 14, wherein, within the aforementioned regions whose conductivity type is same as the signal charge to be collected, a plurality of doped regions having different potential depths are formed so that the potential depth is greater as a distance to the floating diffusion region is shorter.

* * * * *